United States Patent
Hsieh

(10) Patent No.: US 10,075,154 B1
(45) Date of Patent: Sep. 11, 2018

(54) ANALOG FRONT END CIRCUIT OF AN OPTICAL PULSE ENERGY DIGITIZER

(71) Applicant: Rockwell Collins, Inc., Cedar Rapids, IA (US)

(72) Inventor: Han Chi Hsieh, Gaithersburg, MD (US)

(73) Assignee: ROCKWELL COLLINS, INC., Cedar Rapids, IA (US)

( * ) Notice: Subject to any disclaimer, the term of this patent is extended or adjusted under 35 U.S.C. 154(b) by 0 days.

(21) Appl. No.: 15/232,798

(22) Filed: Aug. 9, 2016

(51) Int. Cl.
  *H03K 3/00* (2006.01)
  *H03K 5/15* (2006.01)
  *H03K 19/0944* (2006.01)
  *H03K 17/00* (2006.01)

(52) U.S. Cl.
  CPC ....... *H03K 5/15066* (2013.01); *H03K 17/007* (2013.01); *H03K 19/0944* (2013.01)

(58) Field of Classification Search
  CPC ......... G11C 7/22; G11C 7/222; G11C 7/1051; G11C 7/1078; G11C 11/4076
  See application file for complete search history.

(56) References Cited

U.S. PATENT DOCUMENTS

| | | | |
|---|---|---|---|
| 5,150,364 A * | 9/1992 | Negus | H04J 3/047 327/295 |
| 9,329,453 B1 | 5/2016 | Hsieh | |
| 2008/0144399 A1* | 6/2008 | Cheung | H03K 3/356139 365/189.05 |

* cited by examiner

*Primary Examiner* — Sibin Chen
(74) *Attorney, Agent, or Firm* — Donna P. Suchy; Daniel M. Barbieri

(57) ABSTRACT

An analog front end circuit of an optical pulse energy digitizer includes a multiphase clock circuit, a demultiplexer configured to demultiplex a current pulse stream into demultiplexed current pulse streams, and integrate-and-dump circuits coupled with the demultiplexer. Each ingrate and dump circuit is configured to convert one of the demultiplexed current pulse streams to provide a demultiplexed voltage pulse stream. The multiphase clock circuit includes latches having outputs coupled to a combination logic circuit. The combination logic circuit is configured to provide clock signals for the integrate-and-dump circuits.

14 Claims, 9 Drawing Sheets

ANALOG FRONT END CIRCUIT OF AN OPTICAL PULSE ENERGY DIGITIZER

BACKGROUND

The inventive concepts disclosed herein generally relate to the field of digitizers, including but not limited to optical pulse energy digitizers for direct sampling receivers. In optical electronics, photo-detected optical pulse energy is converted to a voltage signal through conversion circuits such as transimpedance amplifiers (TIAs). This type of conversion is used in applications, such as, high speed, high resolution analog-to-digital converters (ADCs), free space optical communications, coherent optical communications and the like. According to some applications, military radio frequency (RF) systems include wide bandwidth, high speed, high resolution ADCs that operate in, for example, wideband staring signals intelligence (SIGINT) receivers, flexible software defined radio (SDR) system architectures, and low probability of intercept/low probability of detection (LPI/LPD) radars. These systems often use electronic ADC (eADC) components.

U.S. Pat. No. 9,329,453, dated May 3, 2016, entitled OPTICAL PULSE ENERGY DIGITIZER, incorporated herein by reference in its entirety, discloses an analog front end of an optical pulse digitizer or ADC. In a conversion process, pulses generated by a photodiode are converted from current pulses into voltage pulses prior to quantization. As data rates increase, the frequency of the pulses increases accordingly and measuring the peak energy associated with each pulse when the frequency approaches or exceeds a certain level (e.g., 1 gigahertz (GHz) is more difficult.

SUMMARY

In one aspect, embodiments of the inventive concepts disclosed herein are directed to an analog front end circuit of an optical pulse energy digitizer. The analog front end circuit includes a multiphase clock circuit, a demultiplexer configured to demultiplex a current pulse stream into demultiplexed current pulse streams, and integrate-and-dump circuits coupled with the demultiplexer. Each ingrate and dump circuit is configured to convert one of the demultiplexed current pulse streams to provide a demultiplexed voltage pulse stream. The multiphase clock circuit includes latches having outputs coupled to a combination logic circuit. The combination logic circuit is configured to provide clock signals for the integrate-and-dump circuits.

In a further aspect, embodiments of the inventive concepts disclosed herein are directed to a multiphase clock circuit for an optical pulse energy digitizer. The optical pulse energy digitizer includes a 1:N demultiplexer and a set of N integrate-and-dump circuits. N is an integer greater than or equal to four. The multiphase clock circuit includes a combination logic circuit, an inverter, and a set of N latches. The set of N latches is arranged serially such that an output of a preceding latch is coupled to the input of a succeeding latch. An output of a last latch in the set of latches is coupled an input of an inverter and an output of the same inverter is coupled to an input of an initial latch in the set of latches. The outputs of the latches are coupled to the combination logic circuit, and the combination logic circuit is configured to provide N clock signals to the integrate-and-dump circuits.

In a further aspect, embodiments of inventive concepts disclosed herein are directed to a method of conditioning signals in an analog front end circuit of an optical pulse energy digitizer. The method includes demultiplexing a current mode pulse stream into N demultiplexed current mode pulse streams using a demultiplexer. N is an integer. The method also includes converting each of the demultiplexed current mode pulse streams to voltage mode pulse streams using a set of N integrate-and-dump circuits. The demultiplexer and the set of the integrate-and-dump circuits are clocked by N clock signals. The N clock signals are provided by a multiphase clock circuit comprising a set of N latches having N outputs coupled to a combination logic circuit that is configured to provide the N clock signals.

BRIEF DESCRIPTION OF THE DRAWINGS

Implementations of the inventive concepts disclosed herein may be better understood when consideration is given to the following detailed description thereof. Such description makes reference to the annexed drawings, which are not necessarily to scale, and in which some features may be exaggerated and some features may be omitted or may be represented schematically in the interest of clarity. Like reference numerals in the figures may represent and refer to the same or similar element, feature, or function. In the drawings.

DETAILED DESCRIPTION

Figure 1:
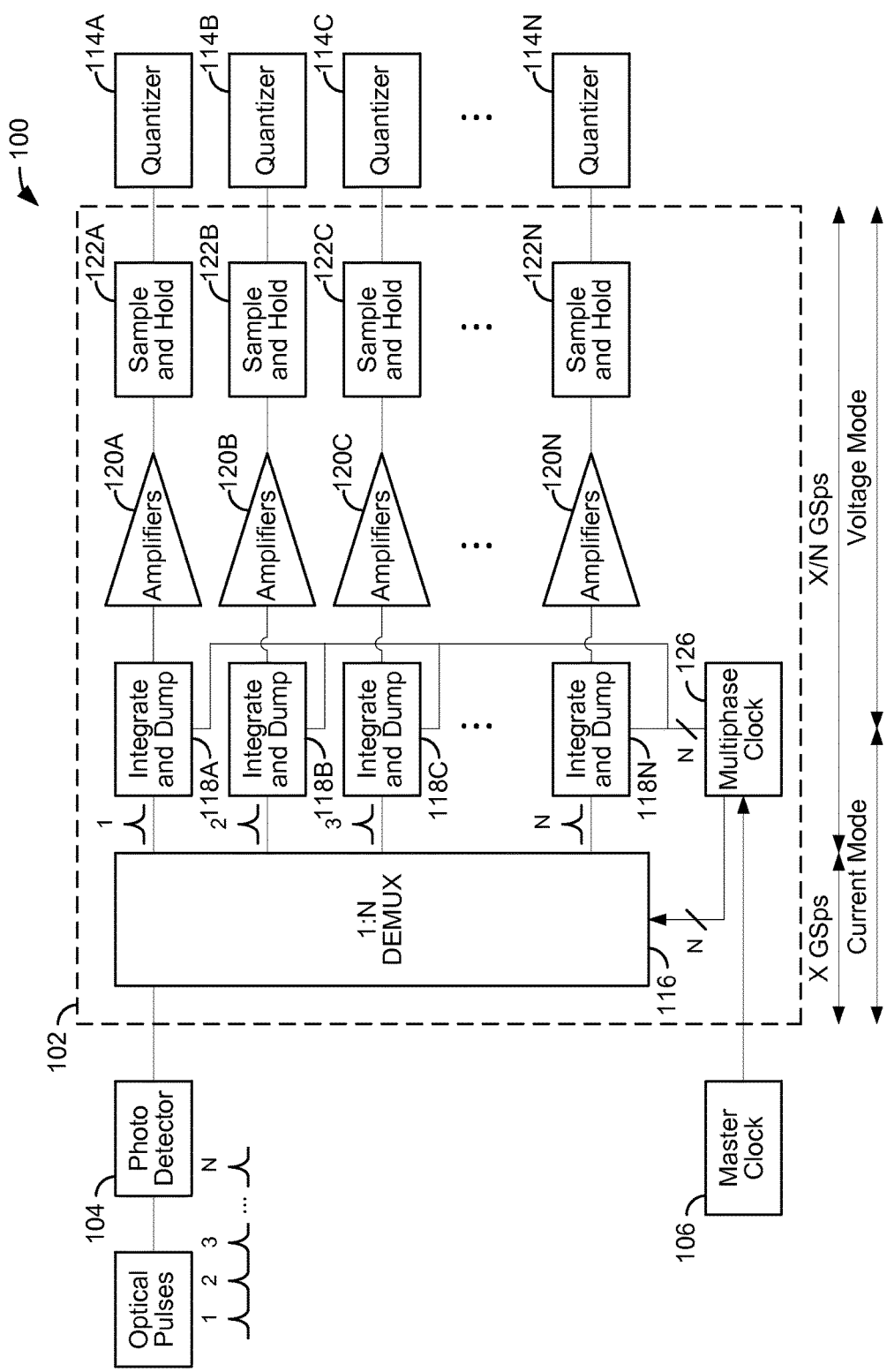
FIG. 1 is a block diagram of an exemplary embodiment of an optical pulse energy digitizer including an analog front end circuit according to the inventive concepts disclosed herein.

Before describing in detail the inventive concepts disclosed herein, it should be observed that the inventive concepts disclosed herein include, but are not limited to, a novel structural combination of data/signal processing components, sensors, and/or communications circuits, and not in the particular detailed configurations thereof. Accordingly, the structure, methods, functions, control and arrangement of components, software, and circuits have, for the most part, been illustrated in the drawings by readily understandable block representations and schematic diagrams, in order not to obscure the disclosure with structural details which will be readily apparent to those skilled in the art, having the benefit of the description herein. Further, the inventive concepts disclosed herein are not limited to the particular embodiments depicted in the exemplary diagrams, but should be construed in accordance with the language in the claims.

Embodiments in accordance with the inventive concepts disclosed herein are directed to multiphase clock circuits and methods with improved resolution and flexibility. The multiphase clock circuits and methods improve accuracy of optical pulse energy digitizers in some embodiments. In some embodiments, a multiphase clock circuit is employed in a photonic ADC that converts photodiode current pulses to voltage signals using an analog front end with an interleaved integrate-and-dump (InD) circuit. The InD circuit has two operating phases, and the interleaved integrate-and-dump circuit requires multiple clock signals in some embodiments. The multiphase clock circuits and the methods described herein are not limited to optoelectronic digitizer applications and can be used in mixed-signal or analog circuits, such as, sample and hold circuits.

In some embodiments, a multiphase clock circuit assigns variable time periods to different operations to improve performance. The clock signals from the multiphase clock circuit defines time periods for data acquisition, hold, dump, or time guard bands to improve the measurement accuracy of the analog front end circuit in some embodiments. The multiphase clock circuit has twice the time resolution compared to divider-based clock generators and is flexible for any even number demultiplexing factor in some embodiments. The multiphase clock circuit generates the clock signals with phases that are synchronous with phases of the master clock in some embodiments.

With reference to FIG. 1, an optical pulse energy digitizer 100 is configured to digitize an optical signal and provided an electric signal. The optical pulse energy digitizer 100 includes an analog front end circuit 102, a photodetector 104, a master clock circuit 106, and a set of quantizers 114A-N. The optical pulse energy digitizer 100 receives optical pulses at a rate of X giga-samples per second (GSps) and transforms the samples to electric current modes signals at a rate of X GSps using the photodetector 104. The analog front end circuit 102 converts the current mode signals at a rate of X GSps to voltage mode signals at a rate of X/N GSps, where N is in integer and X is a number. [0021] The photodetector 104 is any device for converting the optical pulses to electronic signals, such as, a photodiode. In some embodiments, the photodetector 104 is a p-type, intrinsic, and n-type (PIN) diode or a metal-semiconductor-metal (MSM) photodiode. The photodetector 104 receives the optical pulses and generates a stream of current mode pulses for processing by the analog front end circuit 102 in some embodiments.

The master clock circuit 106 is a clock circuit configured to provide a master clock signal in synchronism with the optical pulses. The master clock signal is an electronic pulse signal provided at X GHz in some embodiments. The master clock circuit 106 can derive the master clock signal from the optical pulses to ensure synchronism in some embodiments.

The analog front end circuit 102 converts the pulse stream generated by the photodetector 104 from the current mode to the voltage mode for digitization. In some embodiments, the analog front end circuit 102 includes a demultiplexer (e.g., a 1:N demux) 116, a set of integrate-and-dump circuits 118A-N, a set of amplifiers 120A-N, a set of sample and hold circuits 122A-N, and a multiphase (N-phase) clock circuit 126. The analog front end circuit 102 is a processor, hardwire circuit, programmable device, an application specific integrated circuit (ASIC), or combinations thereof.

The master clock signal is provided to the mutiphase clock circuit 126. The multiphase clock circuit 126 provides N different clock signals for use by respective integrate-and-dump circuits 118A-N and N stages of the demultiplexer 116 in some embodiments. The N clock signals control the allocation of time for operations in the analog front end circuit 102. Embodiments of the multiphase clock circuit 126 are described below with respect to FIGS. 2-4.

The demultiplexer 116 is configured to directly demultiplex the pulse stream generated by the photodetector 104 into N different channels associated with the integrate-and-dump circuits 108A-N. The demultiplexer 116 is configured to demultiplex the pulse stream in response to the clock signals provided by the multiphase clock circuit 126 in some embodiments. In some embodiments, demultiplexing the pulse stream generated by the photodetector 104 directly in a current mode (e.g., prior to voltage conversion) allows the demultiplexing process to be performed more quickly than demultiplexing in a voltage mode (e.g., after voltage conversion), where switch resistance may negatively affect switching speed and cause signal degradation. Demultiplexing in the current mode also makes the 1:N demultiplexer 116 more scalable, which is advantageous in various applications. The repetition rate (shown in FIG. 1 as X GSps as an example) of each channel after demultiplexing by the demultiplexer 116 is effectively lowered N times for all of the subsequent process blocks on that channel in some embodiments. Reducing the repetition rate provides more process time for the subsequent process blocks or operations, which may improve measurement accuracy in some embodiments.

Once the pulse stream has been demultiplexed into N different channels, the signals on each particular channel are processed independently utilizing the set of the integrate-and-dump circuits 118A-N, each dedicated to a particular channel, in some embodiments. In some embodiments, the integrate-and-dump circuits 118A-N are current to voltage converters that convert the current signal received on a particular channel into a voltage signal. In some embodiments, the integrate-and-dump circuits 118A-N are current in, voltage out preamplifiers configured to have an integrating response with a switch that resets or dumps an integrator to zero for initial conditions. In some embodiments, the integrate-and-dump circuits 118A-N are implemented using signal filtering techniques or signal processing techniques. In some embodiments, the analog front end circuit 102 includes other types of circuits or process blocks, such as circuits capable of converting current signals into voltage signals instead of (or in addition to) the integrate-and-dump circuits 108A-N.

The integrate-and-dump circuits 108A-N provide the voltage signals to respective amplifiers 120A-N in some embodiments. The amplifiers 120A-N are buffer amplifiers, each associated with a particular channel in some embodiments. The amplifiers 120A-N include one or more amplifiers connected in series that are utilized to condition the voltage signal generated by the integrate-and-dump circuits 118A-N in some embodiment. The amplifiers 120A-N provide amplified voltage mode signals.

The sample and hold circuits 122A-N receives amplified voltage mode signals from the amplifiers 120A-N. The sample and hold circuits 122A-N are any circuits or processors for sampling or capturing the voltage of a continuously varying analog signal and holding the signal at a constant level for a specified minimum period of time. The sample and hold circuits 122A-N include a capacitor with a switched input in some embodiments. Additional process blocks or circuits may also be utilized to condition the voltage signal generated prior to providing the voltage signal to one of the quantizers 114A-N for digital conversion.

While specific implementations of the demultiplexer 116, the integrate-and-dump circuits 108A-N, the amplifiers 120A-N, and sample and hold circuits 122A-N may vary, they may all be positioned after the demultiplexer 116 in the process flow to take the advantages provided by the demultiplexer 116. As the demultiplexer 116 is configured to directly demultiplex the pulse stream generated by the photodetector 104, the repetition rate on each channel after the demultiplexer 116 may be effectively lowered N times for all of the subsequent process blocks on that channel.

The quantizers 114A-N are coupled to respective sample and hold circuits 122A-N. The quantizers 114A-N perform the quantization operation for analog-to-digital conversion in some embodiments. In some embodiments, the quantizers 116A-N convert the voltage mode signals from the sample and hold circuits 122A-N to digital values or data.

Figure 2:
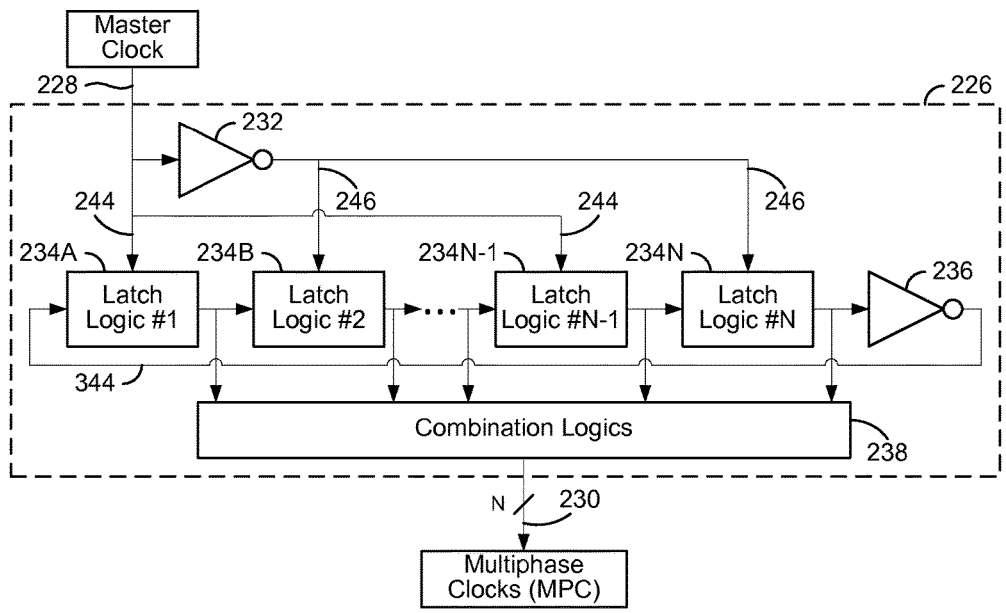
FIG. 2 is a block diagram of an exemplary embodiment of a multi-phase clock circuit for the analog front end circuit illustrated in FIG. 1 according to the inventive concepts disclosed herein.

With reference to FIG. 2, a multiphase clock circuit 226 can be used as the multiphase clock circuit 126 (FIG. 1) in some embodiments. For the purpose of the description below only, N is equal to 4; however, any value of N can be utilized. The multiphase clock circuit 226 receives the master clock signal at a master clock input 228 and provides N clock signals at N number of clock outputs 230. The N clock signals are respectively provided to N stages of the demultiplexer 116 (FIG. 1) and the integrate-and-dump circuits 118A-N (FIG. 1). The multiphase clock circuit 226 includes an inverter 232, a set of latches 234A-N, an inverter 236, and a combination logic circuit 238.

Clock inputs 244 of odd numbered latches (e.g., latches 234A and 234N-1) are provided by the master clock input 228. Clock inputs 246 of even numbered latches (e.g, latches 234B and 234N) are coupled to an output of the inverter 232. The input of the inverter 232 is provided by the master clock input 228. An input of the latch 234A is coupled to an output of the inverter 236, and an input of the inverter 236 is coupled to the output of the latch 234N. An output of the latch 234A is coupled to an input of the latch 234B. An output of the latch 234B is coupled to an input of the latch 234N-1. An output of the latch 234B is coupled to an input of the latch 234N-1. An output of the latch 234N-1 is coupled to an input of the latch 234N. In some embodiments, the set of latches 234A-N are arranged serially such that an output of a preceding latch is coupled to an input of a succeeding latch and an output of a last latch in the set of the latches 234A-N is coupled the input of the inverter 236 and an output of the inverter 236 is coupled to an input of an initial latch in the set of latches 234A-N.

The output of the latches 234A-N are coupled to the combination logic circuit 238 which provides N clock signals for the demultiplexer 116 and the integrate-and-dump circuits 118A-N (FIG. 1) The combination logic circuit 238 can employ any logic scheme to generate the N clock signals according to a combination of selected signals at the output of the latches 234A-N in some embodiments.

The latches 234A-N are digital D-type latches or common mode logic (CML) latches, and the inverters 232 and 236 are digital inverters or CIVIL inverters in some embodiments. The combination logic circuit 238 is digital or CML logic and can be embodied as an array of logic gates configured for providing operations as described herein. In some embodiments, the combination logic circuit 238 is a programmable logic circuit. The latches 234A-N and the combination logic circuit 238 can be part of an ASIC or signal processor in some embodiments.

In operation, the latches 234A and 234N-1 are clocked 180 degrees out of phase with respect to the clock signal provided to the latches 234B and 234N. The latch 234A passes the data at its input to the latch 234B which passes its data to the latch 234N-1 which passes its data to the latch 234N in response to the clock signals. The inverter 236 inverts the output of the latch 234N and the inverted output of the latch 234N is provided as an input to the latch 234A. In some embodiments, multiphase clock circuit 226 includes differential signal lines and the inversion operation is achieved by crossing the differential signal lines and the inverter 236 is not needed. The combination logic circuit 238 receives the signals from each output of latches 234A-N and provides clock signals at the multiphase clock output 230. The latches 234A-N each provide a pulse signal having a 50% duty cycle across N clock pulses of the master clock signal received at the master clock input 228 in some embodiments.

Figure 3:
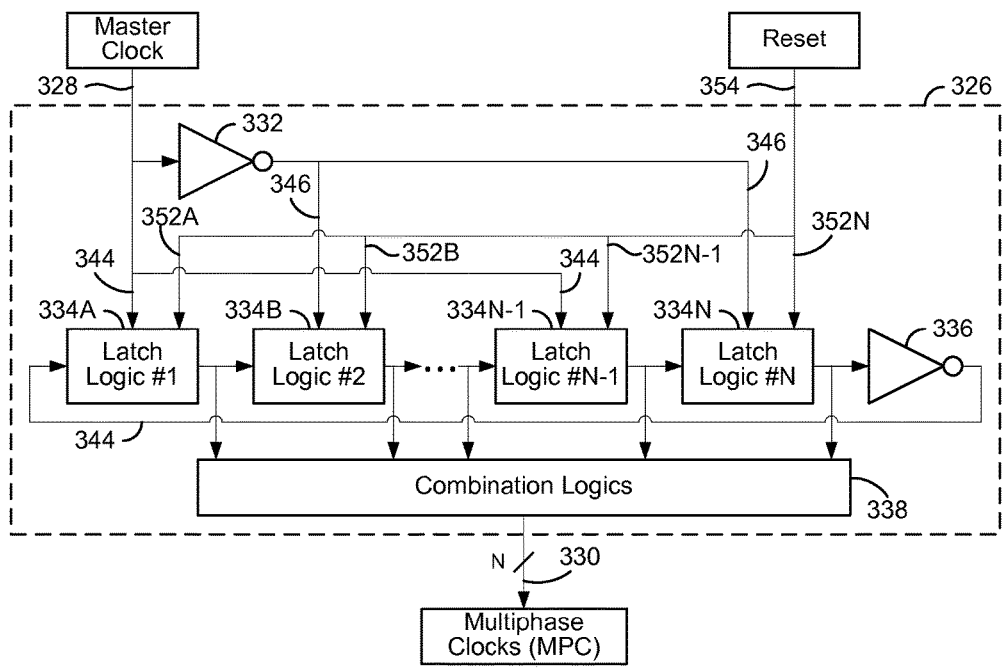
FIG. 3 is a block diagram of an exemplary embodiment of a multi-phase clock circuit for the analog front end circuit illustrated in FIG. 1 according to the inventive concepts disclosed herein.

With reference to FIG. 3, a multiphase clock circuit 326 is similar to the multiphase clock circuit 226 (FIG. 2) and can be used as the multiphase clock circuit 126 (FIG. 1) in some embodiments. For the purpose of the description below only, N is equal to 4; however, any value of N can be utilized. The multiphase clock circuit 326 receives the master clock signal at a master clock input 328 and provides N clock signals at N number of clock outputs 330. The N clock signals are respectively provided to N stages of the demultiplexer 116 (FIG. 1) and the integrate-and-dump circuits 118A-N (FIG. 1). The multiphase clock circuit 326 includes an inverter 332, a set of latches 334A-N, an inverter 336 and combination logic circuit 338.

Clock inputs 344 of odd numbered latches (e.g, latches 334A and 334(N−1) are provided by the master clock input 328. Clock inputs 346 of even numbered latches (e.g, latches 334B and 334(N) are coupled to an output of the inverter 332. The input of the inverter 332 is provided by the master clock input 328. An input of the latch 334A is coupled to an output of the inverter 336, and an input of the inverter 336 is coupled to the output of the latch 334N. An output of the latch 334A is coupled to an input of the latch 334B. An output of the latch 334B is coupled to an input of the latch 334N-1. An output of the latch 334B is coupled to an input of the latch 334N-1. An output of the latch 334N-1 is coupled to an input of the latch 334N.

The latches 334A-N are digital D-type latches or common mode logic (CML) latches, and the inverters 332 and 336 are digital inverters or CML inverters in some embodiments. The latches 334A-N include respective reset inputs 352A-N which are coupled to a reset input 354. A reset signal on the reset input 354 allows the latches 334A-N to be reset to a particular logic signal. The combination logic circuit 338 is digital or CIVIL logic and can be embodied as an array of logic gates configured for providing operations as described herein. In some embodiments, the combination logic circuit 338 is a programmable logic circuit. Inverted or crossed differential signal line can be used instead of the inverter 336.

Figure 4:
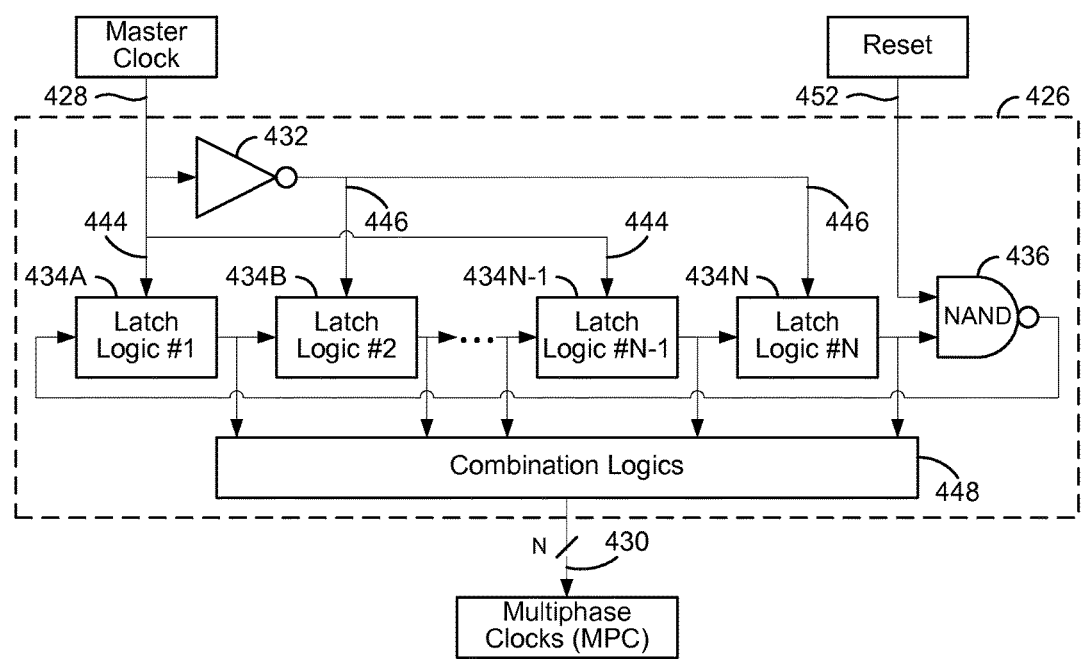
FIG. 4 is a block diagram of an exemplary embodiment of a multi-phase clock circuit for the analog front end circuit illustrated in FIG. 1 according to the inventive concepts disclosed herein.

With reference to FIG. 4, a multiphase clock circuit 426 is similar to the multiphase clock circuit 226 (FIG. 2) and can be used as the multiphase clock circuit 126 (FIG. 1) in some embodiments. For the purpose of the description below only, N is equal to 4; however, any value of N can be utilized. The multiphase clock circuit 426 receives the master clock signal at a master clock input 428 and provides N clock signals at N number of clock outputs 430. The N clock signals are respectively provided to N stages of the demultiplexer 116 (FIG. 1) and the integrate-and-dump circuits 118A-N (FIG. 1). The multiphase clock circuit 426 includes an inverter 432, a set of latches 434A-N, a not and logic (NAND) gate 436, and a combination logic circuit 448.

Clock inputs 444 of odd numbered latches (e.g, latches 434A and 434(N−1) are provided by the master clock input 428. Clock inputs 446 of even numbered latches (e.g, latches 434B and 434(N) are coupled to an output of the inverter 432. The input of the inverter 432 is provided by the master clock input 428. The latches 434A-N are coupled together similar to the latches 234A-N where the inverter 236 is replaced by the NAND gate 436 in some embodiments. A first input of the NAND gate 436 is coupled to an output of the latch 434N and an output of the NAND gate 436 is coupled to an input of the latch 434A in some embodiments.

The latches 434A-N are digital D-type latches or common mode logic (CML) latches, and the inverter 432 and NAND gate 436 are digital devices or CIVIL devices in some embodiments. A reset input 452 is coupled to a second input of the NAND gate 436. A reset signal on the reset input 452 allows the latch 434A to be reset to a low logic signal in some embodiments. The combination logic circuit 448 is digital or CIVIL logic and can be embodied as an array of logic gates configured for providing operations as described herein. In some embodiments, the combination logic circuit 448 is a programmable logic circuit.

Figure 5:
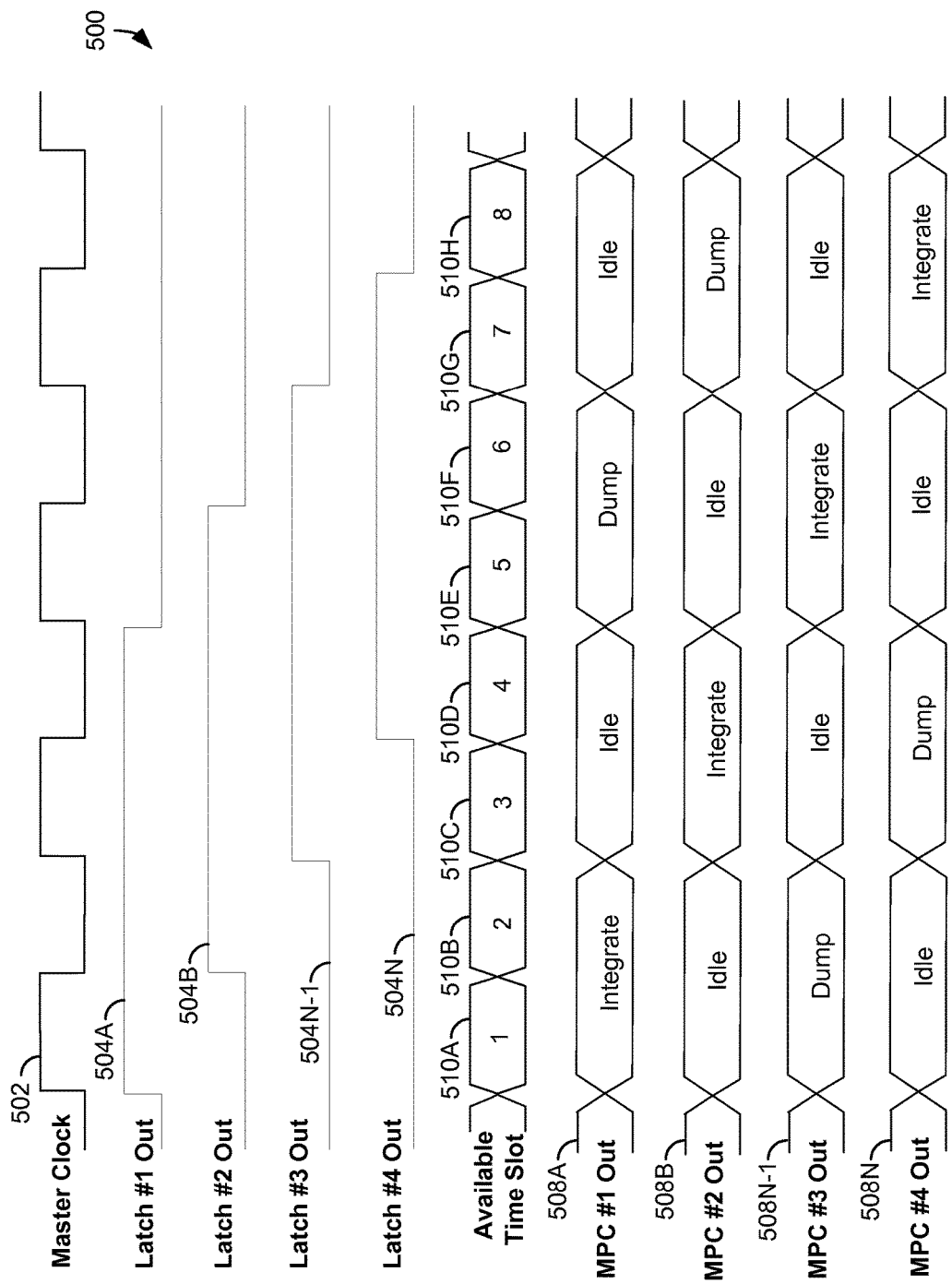
FIG. 5 is an exemplary timing diagram for multi-phase clock signals used in the analog front end circuit illustrated in FIG. 2 according to embodiments of the inventive concepts disclosed herein.

With reference to FIG. 5, a timing diagram 500 includes signals for the multiphase clock circuit 126. The timing diagram 500 is described below with reference to the multiphase clock circuit 226 (FIG. 2), although timing diagram 500 can be associated with the multiphase clock circuits 336 and 436 as well.

A master clock signal 502 is provided at the master clock input 328. The master clock signal is used to clock the latches 234A-N to provide latch output signals 504A-N. The latch output signal 504A is associated with the latch 234A, the latch output signal 504B is associated with the latch output signal 504B, the latch output signal 504N−1 is associated with latch 234N−1 and latch output signal 504N is associated with the output of the latch 234N. In some embodiments, the latch output signals 504A-N are each in phase with the positive edges of the clock signals 444 and 446. In some embodiments, the latch output signals 504A-N are each in phase with the negative edges of the clock signals 444 and 446.

The combination logic circuit 238 receives the latch output signals 504A-N and provides a clock signal 508A, a clock signal 508B, a clock signal 508N-1 and a clock signal 508N. The clock signals 508A-N define integrate, idle, and dump periods in available time slots 510A-H. For example, the clock signal 508A defines an integrate time period during the time slots 510A-B, an idle time period during time slots 510C-D, a dump time period between the time slots 510E-F, and an idle time period during time slots 510G-H. In some embodiments, the idle, integrate-and-dump periods are used for other functions.

The integrate period provides a time for initiating the integrate operation in integrate-and-dump circuits 118A-N in some embodiments. The dump period is a time for resetting integrate-and-dump circuits 108 A-N in some embodiments. Time periods for integrate-and-dump operations can be adjusted depending on length of time for integration and dumping. Idle time provides time for signals to settle, thereby improving accuracy in some embodiments.

Clock signals 508B-D include similar integrate, idle, and dump periods associated with the time slots 510A-G. As shown in FIG. 5, the clock signal 508B is delayed two time slots from clock signal 508A, the clock signal 508C is delayed four time slots from clock signal 508A and clock signal 508D is delayed six time slots from multiphase time clock signal 508A. The clock signals 508A-D are generated from the master clock 502 and provide integrate, idle, and dump periods for four channels, in this N=4 example. The clock signals 508A-N are synchronized with the master clock signal 502 in some embodiments.

The combination logic circuit 238 utilizes various logic circuits to combine, invert, and otherwise condition latch output signals 504A-N to provide appropriate integrate, idle, and dump time periods. For example, and logic (AND) functions, NAND functions, or logic (OR) functions, and inverted functions can be utilized to provide the clock signals 508A-N in response to the latch output signals 504A-N.

In the timing diagram 500, various time units or periods are made available for each channel. It is noted that more processing time may be allocated to certain functions as needed or desired or removed for certain functions as needed or desired. It is to be understood that allocations of processing time may be customized and/or adjusted to fit specific processing requirements. It is also possible to insert optional time guard bands to further improve measurement accuracy.

Referring back to the exemplary optical pulse energy digitizer 100 shown in FIG. 1, it is to be understood that while increasing the processing time allocated for holding a voltage and/or dumping the voltage in an integrate-and-dump circuit of integrate-and-dump circuits 108A-N can provide improved measurement accuracy, time allocations may be optimized for specific operating conditions and therefore may vary without departing from the broad scope of the inventive concepts disclosed herein.

Figure 6:
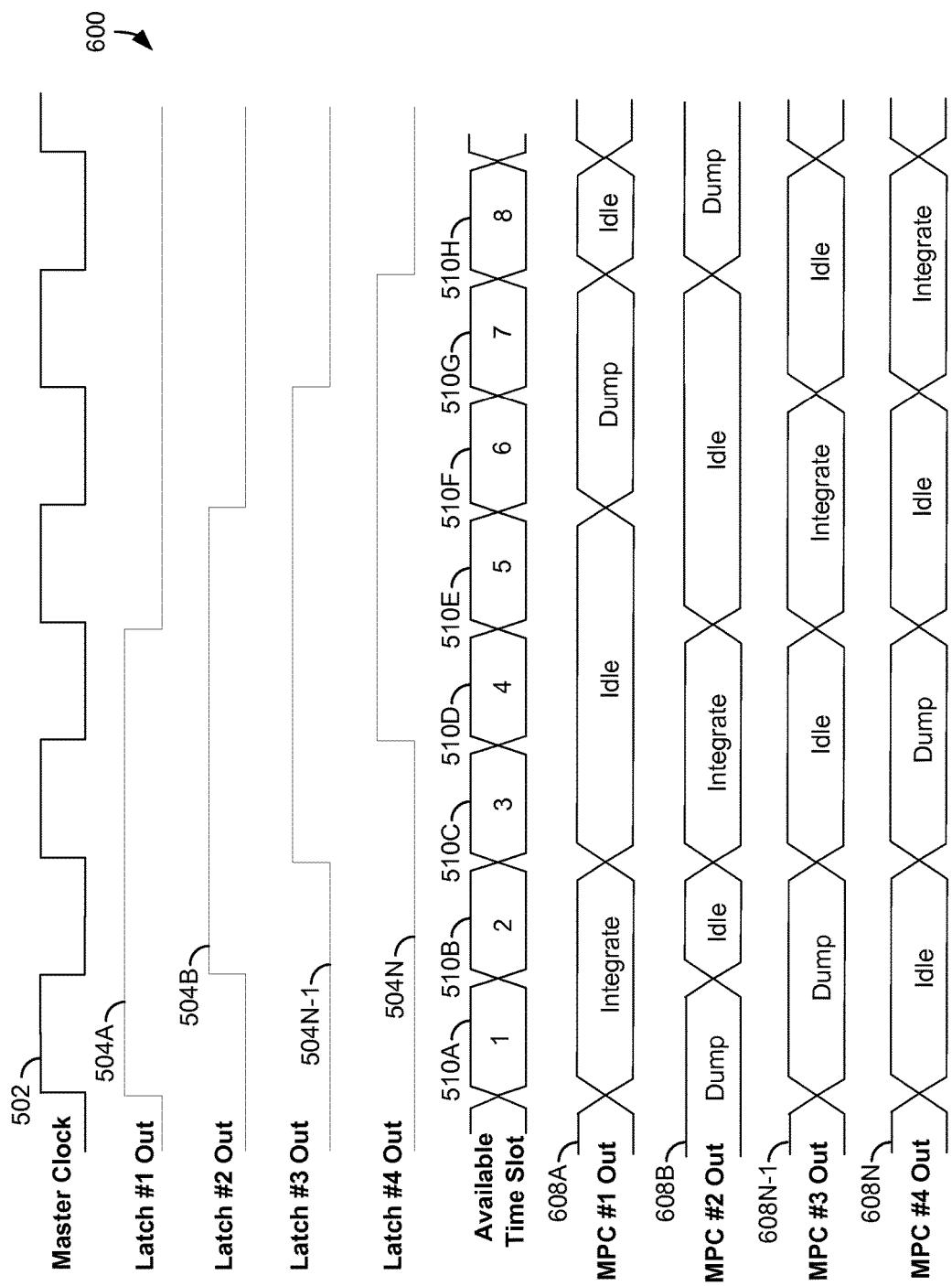
FIG. 6 is an exemplary timing diagram for multi-phase clock signals used in the analog front end circuit illustrated in FIG. 2 according to embodiments of the inventive concepts disclosed herein.

With reference to FIG. 6, a timing diagram 600 includes signals for the multiphase clock circuit 126. The timing diagram 600 is described below with reference to the multiphase clock circuit 226 (FIG. 2), although timing diagram 600 can be associated with the multiphase clock circuits 336 and 436 as well.

The combination logic circuit 238 receives the latch output signals 504A-N and provides a clock signal 608A, a clock signal 608B, a clock signal 608N-1 and a clock signal 608N. The clock signals 608A-N define integrate, idle and dump periods in available time slots 510A-H. For example, the clock signal 608A defines an integrate time period during the time slots 510A-B, an idle time period during time slots 510C-E, a dump time period between the time slots 510F-G and an idle time period during the time slot 510H. The clock signal 604B is delayed two time slots with respect to the clock signal 604A, the clock signal 604N-1 is delayed four time slots with respect to the clock signal 604A and the clock signal 604N is delayed six time slots with respect to the clock signal 604A.

Figure 7:
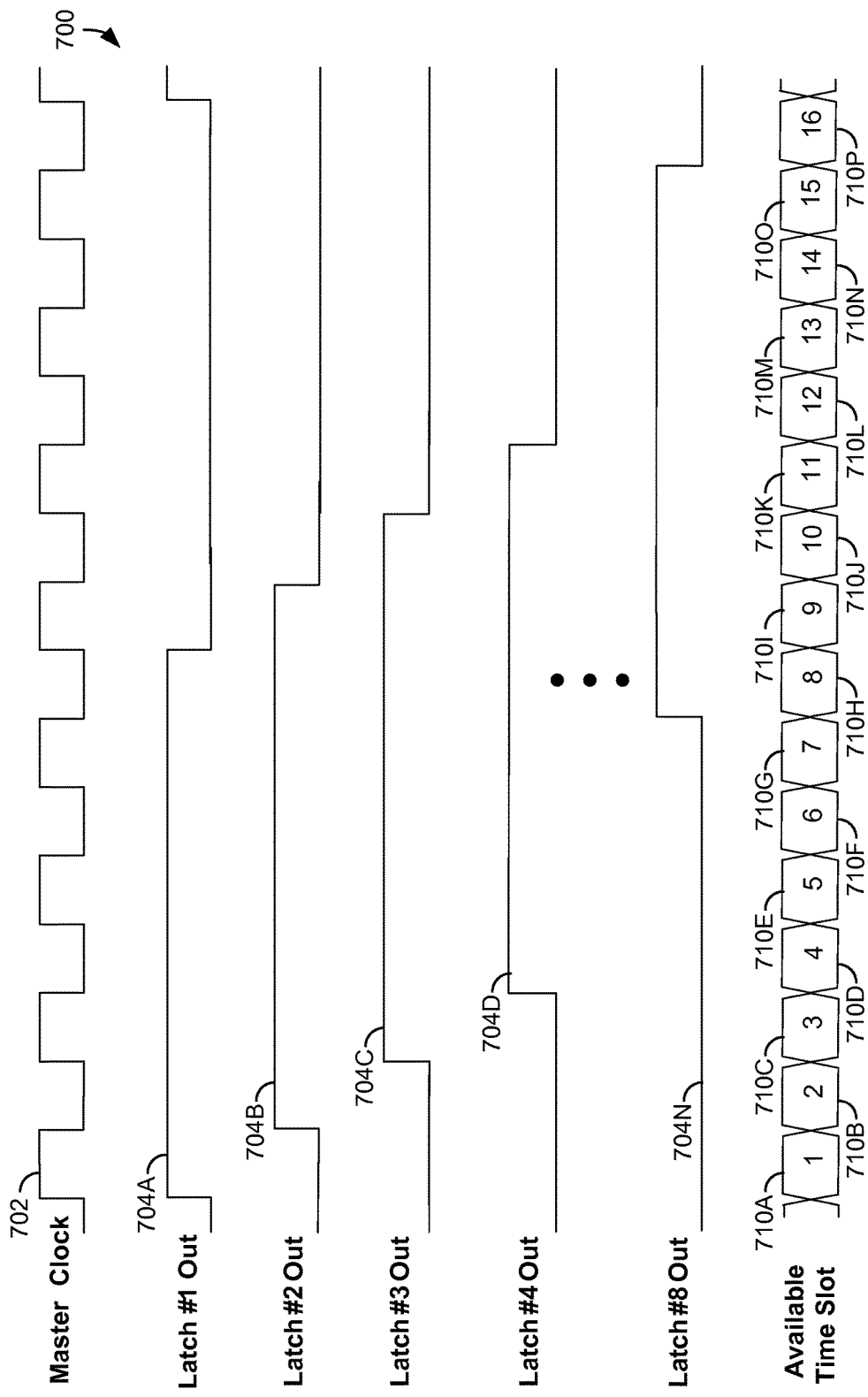
FIG. 7 is an exemplary timing diagram for multi-phase clock signals used in the analog front end circuit illustrated in FIG. 2 according to embodiments of the inventive concepts disclosed herein.

With reference to FIG. 7, a timing diagram 700 includes signals for the multiphase clock circuit 126. The timing diagram 700 is described below with reference to the multiphase clock circuit 126 (FIG. 2), although timing diagram 600 can be associated with the multiphase clock circuits 336 and 436 as well.

The combination logic circuit 238 receives the latch output signals 704A-N where N=8. The timing scheme includes eight latch output signals 704A-N. As the demultiplexing factor increases (N is greater), the clock signals have more available time slots 710A-P and can be adjusted to further optimize performance. Each of the time slots 710A-P is not limited to one operation and can have overlapping or non-overlapping clock phases in some embodiments.

Figure 8:
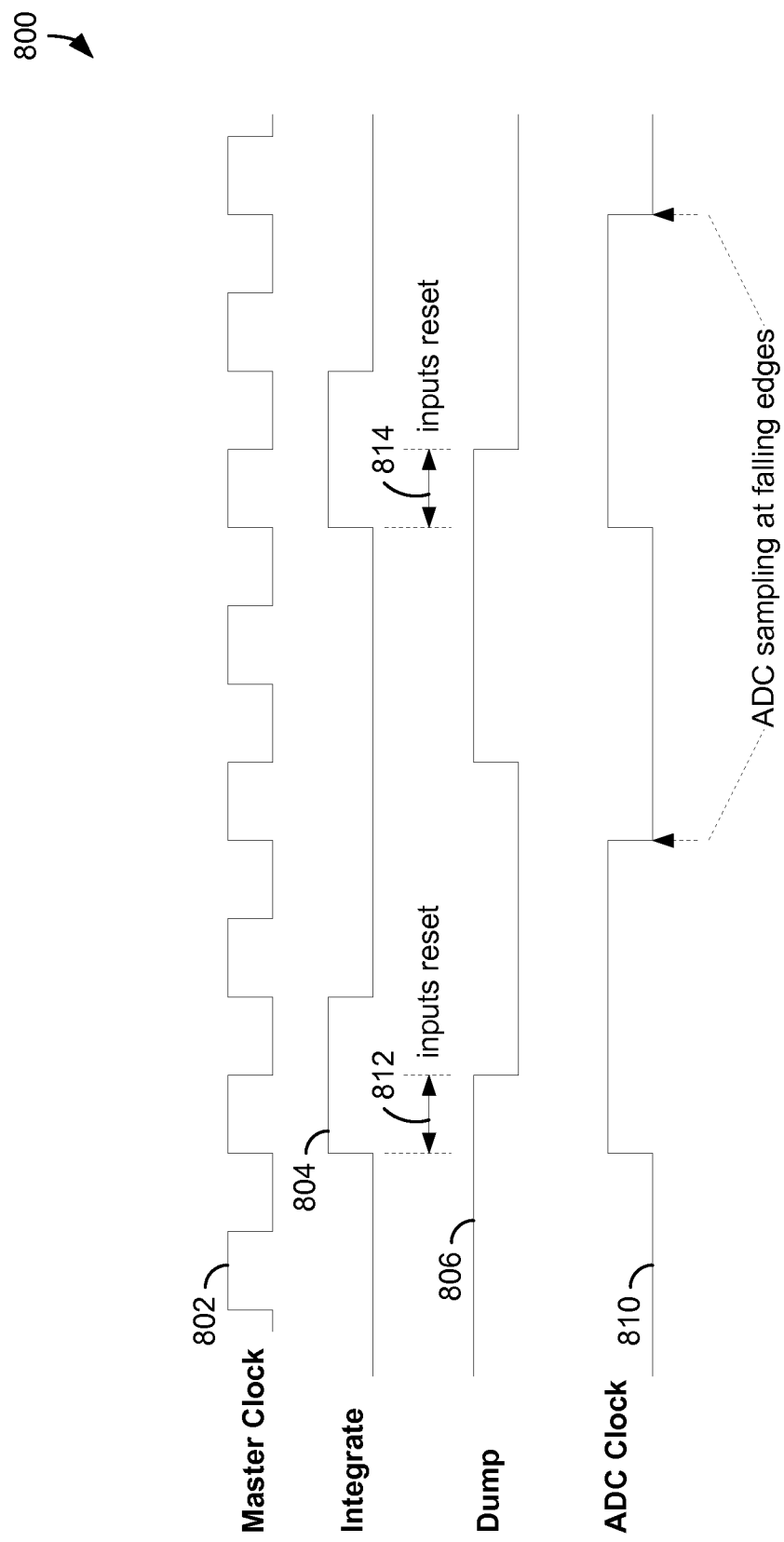
FIG. 8 is an exemplary timing diagram of the multi-phase clock signals for the analog front end circuit illustrated in FIG. 2 according to embodiments of the inventive concepts disclosed herein.

With reference to FIG. 8, a timing diagram 800 includes signals for the multiphase clock circuit 126. The timing diagram 800 is described below with reference to the multiphase clock circuit 126 (FIG. 2), although timing diagram 800 can be associated with the multiphase clock circuits 336 and 436 as well. The multiphase clock circuit 126 receives the latch output signals 504A-N (FIG. 5) and provides an integrate pulse 804 and a dump pulse 806 in coordination with an ADC clock signal 810. The ADC signal can be provided to the quantizers 114A-N. The integrate pulse 804 and the dump pulse 806 overlap at periods 812 and 814 so that the inputs during the integrate phase are reset before the arrival of the optical pulse, thereby reducing adjacent channel interference in some embodiments.

In some embodiments, the periods 812 and 814 of overlap in the timing diagram 800 are achieved by delaying the dump pulse 806 using delay circuits to give more time for sampling With two phases of the master clock signal 802 for integration and four phases for reset or dump function, the overlap at the period 812 and the period 814 across one clock phase cancels adjacent channel interference due to the input reset in some embodiments. The signal from the previous channel is not carried over to the rest of the channel because it resets before the input pulse is integrated in some embodiments.

Figure 9:
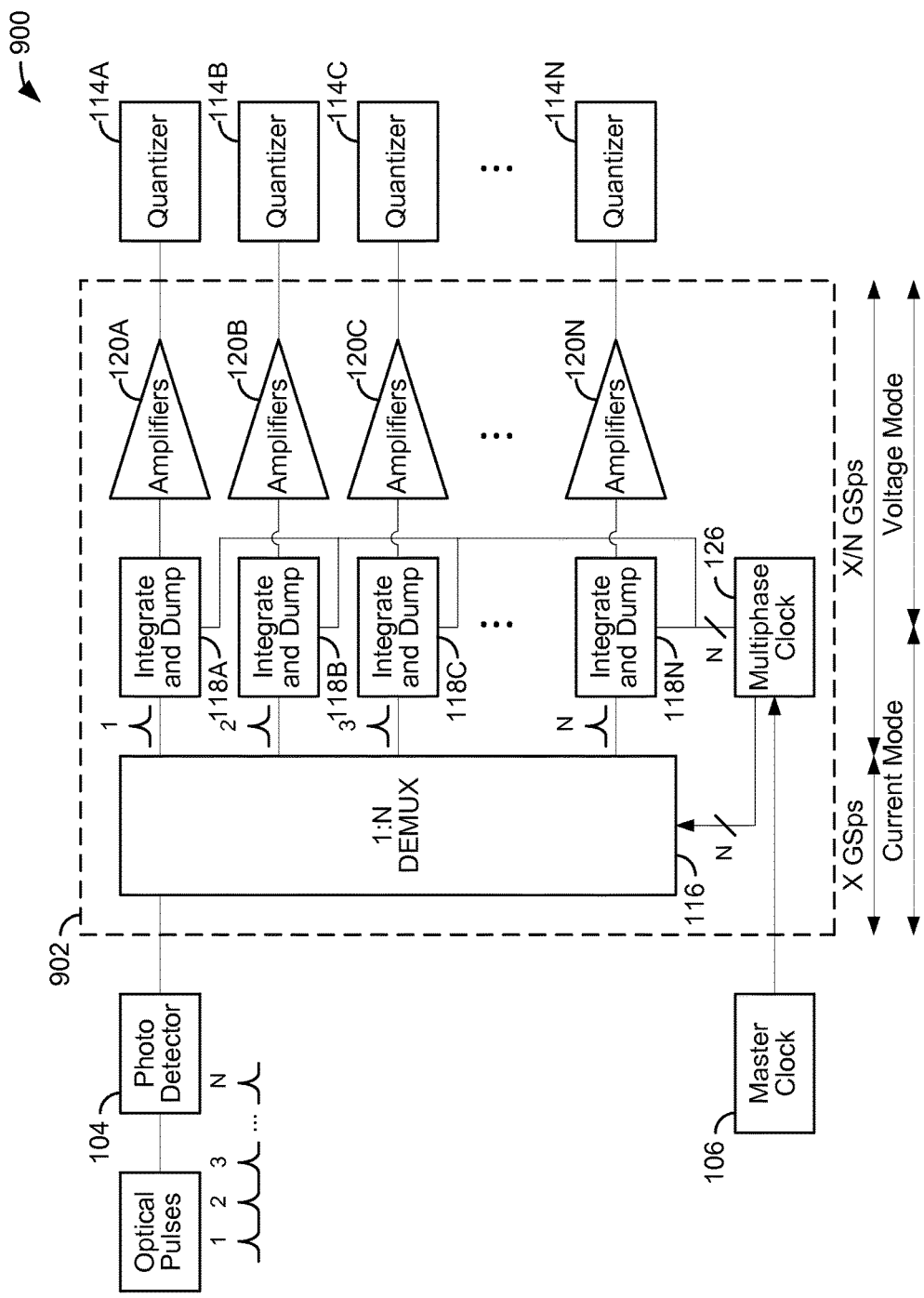
FIG. 9 is a block diagram of an exemplary embodiment of an optical pulse energy digitizer including an analog front end circuit according to the inventive concepts disclosed herein.

With reference to FIG. 9, an optical pulse energy digitizer 900 is configured to digitize an optical signal and provided an electric signal. The optical pulse energy digitizer 100 includes an analog front end circuit 902, the photodetector 104, the master clock circuit 106, and the set of quantizers 114A-N. The optical pulse energy digitizer 900 receives optical pulses at a rate of X giga samples per second (GSps) and transforms the samples to electric current modes signals at a rate of X GSps using the photodetector 104. The analog front end circuit 102 converts the current mode signals at a rate of X GSps to voltage mode signals at a rate of X/N GSps where N is in integer and X is a number.

The analog front end circuit 902 is similar to the analog front end circuit 102 and converts the pulse stream generated by the photodetector 104 from the current mode to the voltage mode for digitization. In some embodiments, the analog front end circuit 102 includes the demultiplexer (e.g., a 1:N demux) 116, the set of integrate-and-dump circuits 118A-N, the set of amplifiers 120A-N, and the multiphase (N-phase) clock circuit 926. The multiphase clock circuit 926 is similar to the multiphase clock circuit 126. The amplifiers 120A-N are coupled to quantizers 114A-N without a sample and hold circuit there between in some embodiments. The analog front end circuit 902 is a processor, hardwire circuit, programmable device, an application specific integrated circuit (ASIC), or combinations thereof.

Figure 10:
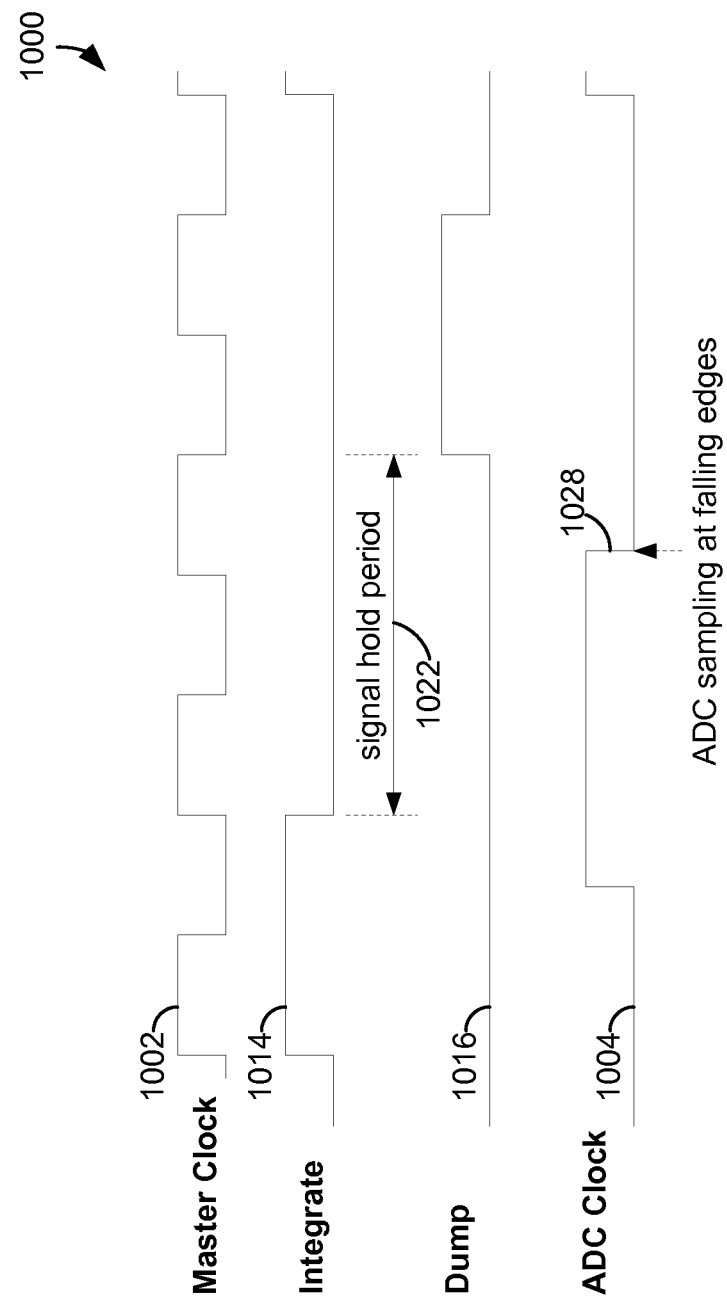
FIG. 10 is an exemplary timing diagram for multi-phase clock signals used in the analog front end circuit illustrated in FIG. 9 according to the inventive concepts disclosed herein.

With reference to FIG. 10, a timing diagram 1000 includes signals for the multiphase clock circuit 926. A master clock signal 1002 is utilized to provide an ADC clock signal 1004. The multiphase clock circuit 926 provides an integrate signal 1014 and a dump signal 1016 that has a signal hold period 1022 for a number of clock cycles of the master clock signal 1022. In some embodiments, the signal hold period 1022 is provided during a transition 1028 of the ADC clock signal 1004. By assigning more time (e.g., the signal hold period 1022) between integrate-and-dump operations in the multiphase clock scheme, the integrate signals have more time for the ADC to acquire and hence eliminate the need for a sample and hold circuit, such as the sample and hold circuits 122A-N (FIG. 1).

It is also contemplated that while various techniques may be utilized to provide clock signals to the various channels to control the timing, certain implementations of the analog front end circuits 102 and 902 may utilize a single multiphase clock circuit 126 (as shown in FIG. 1) or 926 (as shown in FIG. 9) to provide synchronized controls for all channels. For instance, the multiphase clock circuit 126 may be configured as an N-phase clock, which may be capable of distributing a clock signal to each of the N channels in the analog front end circuit 102. It is contemplated that driving the various channels using the same multiphase clock circuit 126 may help to provide well-defined phases for data acquisition, hold, dump, and time guard bands across the various channels, ensuring consistency and accuracy of the multi-channel front end processes described above.

It is contemplated that the analog front end circuits 102 and 902 configured in accordance with the inventive concepts disclosed herein may be utilized in various types of optical pulse energy digitizer, including photonic ADCs and the like. Embodiments of the inventive concepts of the present disclosure may be implemented utilizing any combination of software and hardware technology and by using a variety of technologies without departing from the broad scope of the inventive concepts or without sacrificing all of their material advantages. It is to be understood that the specific order or hierarchy of steps in the processes disclosed is an example of exemplary approaches. It is to be understood that the specific order or hierarchy of steps in the processes may be rearranged while remaining within the broad scope of the present disclosure.

It is contemplated that various changes may be made in the form, construction, and arrangement of the components thereof without departing from the broad scope of the inventive concepts or without sacrificing all of their material advantages. The form herein before described being merely an explanatory embodiment thereof, it is the intention of the following claims to encompass and include such changes.

What is claimed is:

1. An analog front end circuit of an optical pulse energy digitizer, the analog front end circuit comprising:
   a demultiplexer configured to demultiplex a current pulse stream into a plurality of demultiplexed current pulse streams;
   a plurality of integrate-and-dump circuits coupled to the demultiplexer, each of the plurality of the integrate-and-dump circuits being configured to convert one of the plurality of demultiplexed current pulse streams to provide a demultiplexed voltage pulse stream; and
   a multiphase clock circuit comprising a plurality of latches having outputs coupled to a combination logic circuit, the combination logic circuit being configured to provide a plurality of clock signals for the plurality of integrate-and-dump circuits, wherein each of the clock signals is a respective clock signal for a respective integrate-and-dump circuit of the integrate-and-dump circuits.

2. The analog front end circuit of claim 1, further comprising:
a plurality of sample and hold circuits coupled with the plurality of integrate-and-dump circuits and configured to sample and hold the demultiplexed voltage pulse stream produced by the integrate-and-dump circuits, wherein each of the sample and hold circuits is a respective sample and hold circuit for a respective integrate-and-dump circuit of the integrate-and-dump circuits.

3. The analog front end circuit of claim 1, further comprising:
a plurality of amplifiers coupled with the plurality of integrate-and-dump circuits, wherein each of the plurality of the amplifiers is a respective amplifier for a respective integrate-and-dump circuit of the integrate-and-dump circuits.

4. The analog front end circuit of claim 1, wherein the demultiplexer is a 1:N demultiplexer configured to lower a repetition rate of each particular demultiplexed current pulse stream of the plurality of demultiplexed current pulse streams N-times in comparison to a repetition rate of the current pulse stream generated by a photodiode.

5. The analog front end circuit of claim 1, wherein the latches of the multiphase clock circuit comprises a set of odd latches having a clock input coupled to receive a master clock signal and a set of even latches having a clock input coupled to receive an inverted master clock signal.

6. The analog front end circuit of claim 1, wherein the integrate-and-dump circuit is allocated a process time according to the clock signals for holding a voltage and a process time for dumping the voltage according to a repetition rate of each demultiplexed current pulse stream.

7. The analog front end circuit of claim 1, the multiphase clock circuit comprises differential signal lines and the differential signal lines are crossed at a location between a last latch and a first latch of the latches to achieve an inversion operation.

8. The analog front end circuit of claim 1, wherein the multiphase clock circuit comprises an inverter or a NAND gate between a last latch and a first latch of the latches.

9. A method of conditioning signals in an analog front end circuit of an optical pulse energy digitizer, the method comprising:
demultiplexing a current mode pulse stream into N demultiplexed current mode pulse streams using a demultiplexer, where N is an integer; and
converting each of the demultiplexed current mode pulse streams to each of a plurality of respective voltage mode pulse streams using a set of N integrate-and-dump circuits, wherein the demultiplexer and the set of the integrate-and-dump circuits are clocked by N clock signals, the N clock signals being provided by a multiphase clock circuit comprising a set of N latches having N outputs coupled to a combination logic circuit, the combination logic circuit being configured to provide the N clock signals.

10. The method of claim 9, further comprising:
receiving a master clock signal at the multiphase clock circuit.

11. The method of claim 10, wherein the master clock signal is synchronized with an optical pulse stream associated with the current mode pulse stream.

12. The method of claim 11, further comprising converting the optical pulse stream to the current mode pulse stream.

13. The method of claim 9, wherein the demultiplexer is a 1:N demultiplexer.

14. The method of claim 9, wherein the N latches are arranged serially such that an output of a preceding latch is coupled to an input of a succeeding latch, wherein an output of a last latch in the set of the latches is coupled an input of an inverter and an output of the inverter is coupled to an input of an initial latch in the set of the N latches.

* * * * *